United States Patent [19]
Leizerovich et al.

[11] Patent Number: 6,043,712
[45] Date of Patent: Mar. 28, 2000

[54] LINEAR POWER AMPLIFIER

[75] Inventors: Gustavo D. Leizerovich, Miami Lakes; Michael F. Viola, Pembroke Pines, both of Fla.

[73] Assignee: Motorola, Inc., Schaumburg, Ill.

[21] Appl. No.: 09/118,115

[22] Filed: Jul. 17, 1998

[51] Int. Cl.$^7$ .............. H03G 3/10; H03F 3/04; H02H 7/20; H01Q 11/12
[52] U.S. Cl. ............ 330/279; 330/298; 330/297; 455/126
[58] Field of Search .................. 330/129, 279, 330/285, 207 P, 298, 51, 297; 455/126, 115

[56] References Cited

U.S. PATENT DOCUMENTS

| | | |
|---|---|---|
| 4,994,757 | 2/1991 | Bickley et al. ............ 330/285 |
| 5,101,173 | 3/1992 | DiPiazza et al. .......... 330/136 |
| 5,142,240 | 8/1992 | Isota et al. ............... 330/149 |
| 5,150,361 | 9/1992 | Wieczorek et al. ....... 370/95.1 |
| 5,420,536 | 5/1995 | Faulkner et al. .......... 330/129 |
| 5,559,807 | 9/1996 | van den Heuvel et al. ... 370/95.3 |
| 5,729,539 | 3/1998 | Heeschen et al. ......... 370/332 |
| 5,874,860 | 2/1999 | Brunel et al. ............. 330/285 |

Primary Examiner—Robert Pascal
Assistant Examiner—Patricia T. Nguyen
Attorney, Agent, or Firm—Scott M. Garrett

[57] ABSTRACT

A power amplifier stage includes a linear radio frequency (RF) power amplifier (106), having a bias port and a supply port. The bias port receives a DC amplifier bias potential (142) for controlling the power gain of the RF amplifier stage and the supply port receives a power supply. A bias control (202) switchably provides the DC amplifier bias potential (142) at the bias port while a supply control switchably provides the power supply (210) in response (160) to the bias control (202) at the supply port.

18 Claims, 3 Drawing Sheets

6,043,712

LINEAR POWER AMPLIFIER

TECHNICAL FIELD

This invention relates in general to linear amplifiers and in particular to Radio Frequency (RF) power amplification of RF signals in a Cartesian feedback loop.

BACKGROUND

Increasing demand for mobile and personal communication services has increased pressures for extra capacity in the radio frequency (RF) spectrum while requiring the use of power efficient small sized batteries to power the subscriber units of these communication services. Linear modulation (e.g. II/4 Digital Quadrature Phase Shift Keying (DQPSK) or Quad-16 Quadrature Amplitude Modulation (QAM)) maximizes spectrum capacity but are not necessarily the most power efficient.

Because linear amplifiers can amplify signals with any combination of amplitude and phase modulation, the choice of modulation scheme is not limited by the transmitter and hence can be software selectable. This is advantageous in military applications, and in commercial applications crossing international borders and standards. Other applications for linear amplifications include various digital cellular and Private Mobile Radio (PMR) systems, traditional Amplitude Modulation (AM), Single Side-Band (SSB) systems, instances where transmitter turn-on is to be well controlled such as bandlimited pulse systems found in radar and paging applications, and in Time Division Multiple Access (TDMA) systems.

It has long been known that feedback can linearize non-linear systems. Cartesian Feedback for example, which uses negative feedback to the baseband quadrature modulation provides excellent reduction in intermodulation distortion with low complexity and cost. A typical example of what is achievable with Cartesian feedback is given by M. Johannson and T. Mattsson, "Transmitter Linearization Using Cartesian Feedback for Linear TDMA Modulation", in the proceedings of the 41st IEEE Vehicular Technology Conference, St. Louis, U.S.A. VTC-91 pp. 439–444, May 1991.

Dynamic control of the DC gate bias has also been shown to improve amplifier efficiency by A. A. M. Saleh and D. C. Cox, "Improving the Power-Added Efficiency of FET Amplifiers Operating with Varying Envelope Signals", IEEE Transactions on Microwave Theory and Techniques, Vol. 31, January 1983. U.S. Pat. No. 4,631,491 also demonstrates that feedback can be used to control the collector and base bias in a Bipolar Junction Transistor based RF amplifier to improve the efficiency of the amplifier. More recently, U.S. Pat. No. 5,420,536 demonstrates that dynamic bias modulation may be used by an RF amplifier to maximize spectral control and reduce IF distortion.

However, it is desired to improve amplifier operation and reduce current drain in a low voltage linear amplifier in a TDMA system where dynamic envelope modulation is not used or in any other power amplifier where the bias input is required before the supply.

DETAILED DESCRIPTION OF THE PREFERRED EMBODIMENT

It has long been known that negative feedback can linearize non-linear systems. To linearize RF amplifiers, the negative feedback can be formed a number of ways; namely, at RF or IF, or at baseband in the form of Polar representation or Cartesian representation. A standard Cartesian feedback loop is known.

Figure 1:
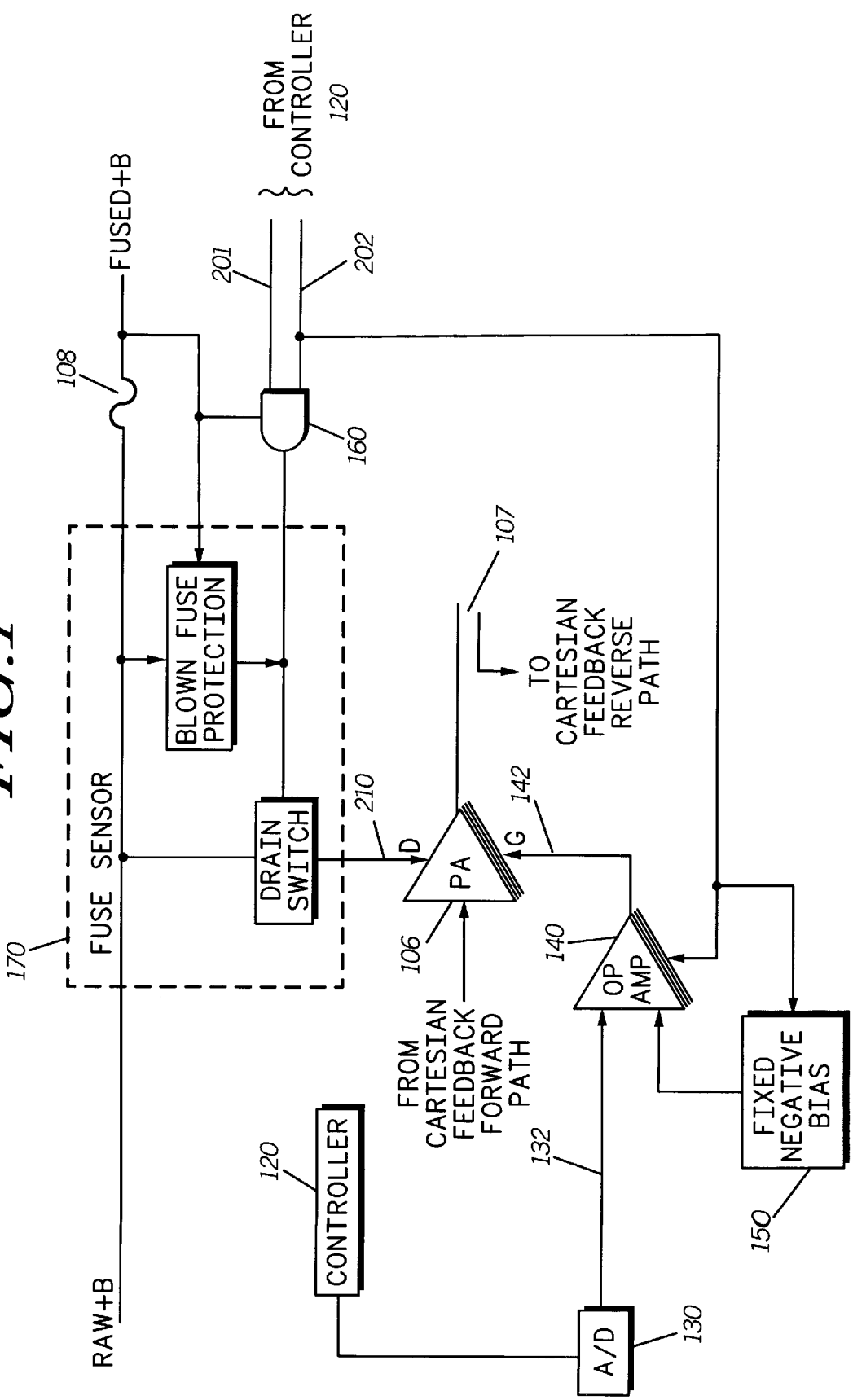
FIG. 1 is a block diagram showing a linear RF power amplifier stage, in accordance with the present invention.

Referring to FIG. 1, a diagram of a preferred embodiment of a linear low voltage RF power amplifier stage for use in a Cartesian feedback loop in accordance with present invention is shown. A linear radio frequency (RF) power amplifier 106 has an input signal from a Cartesian feedback forward path AC coupled within the power amplifier transistor device to a first or bias port. The power amplifier 106 amplifies the input signal and produces a corresponding output signal at a second or power port. A coupler 107 couples the output signal that is AC coupled to the second port to a Cartesian feedback reverse path.

However, the present invention can be used in any power amplifier whose bias is required to be present first before the device is supplied with power, as part of the device requirements. Power amplifier 106 has particular applicability for use within the linear transmitter circuit of an RF communications device (not shown) such as a two-way radio, cellular telephone, cordless telephone, base station equipment, radio repeater, any combination and the like, and especially for a TDMA communication device.

In accordance with the preferred embodiment, the power amplifier 106 of the present invention is anticipated for use in a hand-held, battery powered two-way radio communications device with telephone interconnect, short message service (SMS), and radio dispatch capabilities. The device in question is designed to operate over a plurality frequencies where the optimum operating frequencies range from 806 megahertz (MHz) to 825 MHz.

The battery is preferably a single Lithium Ion single cell 3.6 nominal volt battery which is approximately forty percent lighter and smaller than traditional Nickel Mercury batteries to provide the RF amplifier power supply voltage or raw battery supply. In addition, the device's peak output power is nominally 3.5 watts (W) for the nominal 3.6 volt battery.

The raw battery supply +B is coupled to a fuse 108 to provide a fused battery supply +B for providing battery supply to other circuits, such as an AND gate 160 for reliably controlling a linear RF amplifier 106 running off the raw +B battery supply.

In general, the power supply of the RF amplifier 106 for controlling the drain or second port of the power amplifier 106, as well as the gate bias circuit for controlling the first port or the gate of the power amplifier 106 are switchably controlled to align with the TDMA transmit time slots. This switchable bias circuitry, applied to the RF amplifier's gate bias and supply lines, represents the additional components to a known power amplifier which gives the added reliability improvements to a linear RF power amplifier stage for use in a Cartesian feedback loop, for example. The switchable bias circuitry selects the best operating bias for a given output signal during the TDMA transmit time slot.

In accordance with the teachings of the present invention, the linear radio frequency (RF) power amplifier 106 has a gate for switchably receiving a DC amplifier bias potential for controlling the power gain of the RF amplifier and a drain for switchably receiving a battery supply. The amplifier can be based on a range of active devices such as pseudomorphic high electron mobility transistor (PHEMT) transistor FETs in the linear operation range made preferably from a gallium arsenide (GaAs) material. While the anticipated transistor selected for the power amplifier 76 is a pseudomorphic high electron mobility transistor (PHEMT) transistor requiring a negative source for a low voltage operation, other devices may be substituted therefore. Available alternatives include, but are not limited to, field effect transistors (FETs), heterostructure field effect transistors (HFETs), and metal semiconductor field effect transistor (MESFET), metal oxide semiconductor field effect transistor (MOSFET) devices or any other power amplifier technology or device.

The detailed description set forth in connection with the appended drawings is intended merely as a description of the presently preferred embodiments of the invention, and is not intended to represent the only form in which the present invention may be constructed or utilized. The description describes the implementation of the invention only in connection with the illustrated embodiments. It is to be understood, however, that the implementation of the invention can be accomplished by different electronic embodiments and it is intended these be encompassed within the spirit and scope of the invention. Where wider ranges of efficiency are required, cascaded stages of more than one individual transistors may be employed.

As is known, the RF power amplifier in the linear operating class is dependent on the gate bias voltage. The gate bias voltage can be set by a controller 120. Typically, the controller can be implemented as a microprocessor or a digital signal processor (DSP) circuit. To provide the optimum gate bias voltage for the tight gain requirements of the power amplifier 106 operating in a Cartesian feedback loop, a predetermined desired range of factory tested and selected gain control input information based on the tested power amplification power-out results is first obtained via calculation or a look-up table and processed or stored in the controller 120.

Once the factory test results of a particular power amplifier is obtained, the particular positive digital gain control input for the desired power output performance is selected to provide the optimum DC bias voltage at the desired output RF level. These gain control inputs form a range of numbers which are pre-computed or otherwise obtained from the measured characteristics of the amplifier. The resultant range of digital gain control inputs are converted to analog levels by a digital-to-analog converter 130 to arrive at a range of positive digital-to-analog signals from 1.5V to 2.5V to form a power amplifier gain signal 132 for controlling the RF power amplifier gain.

Since a PHEMT power amplifier 106 requires a negative bias of −0.5V to −1.5V in the gate signal 142, the positive range of the power amplifier gain signal 132 has to be inverted into the proper range for the PHEMT amplifier 106. It is to be noted that if negative bias is not needed, the range of positive digital-to-analog signals may directly or via an optional translating device, be applied to the bias input of the power amplifier 106.

An operational amplifier 140 provides a shifted negative DC amplifier bias potential for each of the positive digital-to-analog or power amplifier gain signal 132 based on a fixed negative source 140, if the power amplifier device has the negative bias requirement. Preferably, the operational amplifier 140 is an LMC7101 part available from National Semiconductor.

The fixed negative source 140 is preferably implemented as a Switched Capacitor Voltage Converter preliminarily designated with the model number of LM2664 available from National Semiconductor or is implemented by another equivalent or suitable device.

The negative source 140 provides the negative voltage for the level shifting. The range of shifted negative DC amplifier bias potentials are then applied to the gate of the RF power amplifier to force the gate bias line to a level known to give the best operating efficiency.

In general, the signal delay through the gate and drain bias circuits are purposely made different to safely turn ON and OFF the power amplifier 106. The timing is controlled by introducing delays to force a difference in the signal paths.

Figure 2:
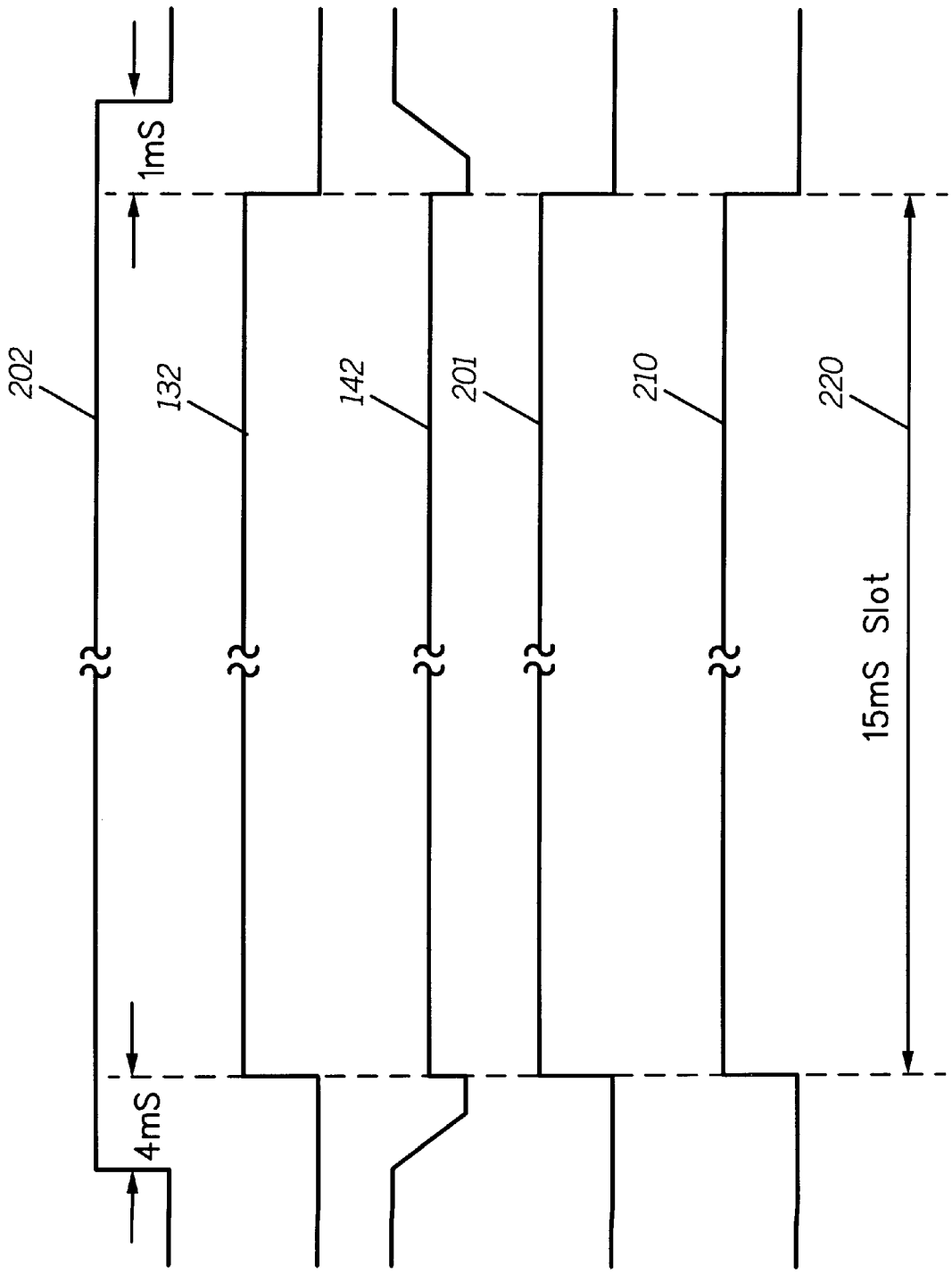
FIG. 2 is a timing diagram for the control signals of the power amplifier stage of FIG. 1.

Referring to FIGS. 1 and 2, controller 120 generates a first control signal 201 for defining a first activation period, encompassing the fifteen (15) milliseconds TDMA transmit time slot 220, and a second control signal 202 for defining a second activation period. The second activation period is purposely designed to be longer in duration than the first activation period to cover the TDMA transmit time slot 220 fully and to have adequate time to warm-up and turn OFF the power amplifier as seen in FIG. 2. The second activation period is about 4 milliseconds longer in duration before the start of the TDMA transmit slot and about 1 milliseconds longer in duration after the end of the TDMA transmit slot or after the end of the first activation period. It must be stated that the exacting timing of these delays can be changed.

The second control signal 202 is coupled to the operational amplifier 140 for activating the level shifting and scaling operation in order to provide the shifted negative DC amplifier bias potential to the power amplifier gate during the second activation period to ensure that the gate is activated before the drain.

In order for the operational amplifier 150 to work properly, a negative bias source 150 is also switched at the same time that the operational amplifier 140 is switched. Hence, both the negative bias source 150 and the operational amplifier 140 are shutdown substantially outside the TDMA transmit slots to save current drain. On the other hand, they are both turned ON, during the longer second activation period covering a slightly longer duration than the TDMA transmit slots and OFF, during the substantially non-TDMA transmit slots, for providing the fixed negative bias source signal and the bias signal to the gate only during the second activation periods of the TDMA transmit slots.

An AND gate 160 receives the first 201 and second 202 control signals for providing an ANDed output signal to allow the drain current flow 210 of the battery supply +B to the power amplifier drain input only during the 15 milliseconds TDMA transmit time slot of the first control signal 201.

The second control signal 202 is turned ON 4 milliseconds, consisting a first delay, prior to the beginning of the TDMA transmit slot to ensure that the gate bias will be steady when the first control signal 201 is made active, turning ON a drain switch, controlling the activation of the drain of the power amplifier 106. For de-activating the RF power amplifier 106, the gate bias control includes a delay of about 1 milliseconds longer than the predetermined period between TDMA transmit time slots such that the power amplifier 106 is turned OFF sufficiently prior to removing the shifted negative DC amplifier bias potential at the first port or gate during a non-TDMA transmit time slot.

A fuse sensor 170 coupled to the fuse 108 disables the drain and overrides the AND gate output signal in response to sensing a blown fuse battery supply condition in order to provide blown fuse protection.

Figure 3:
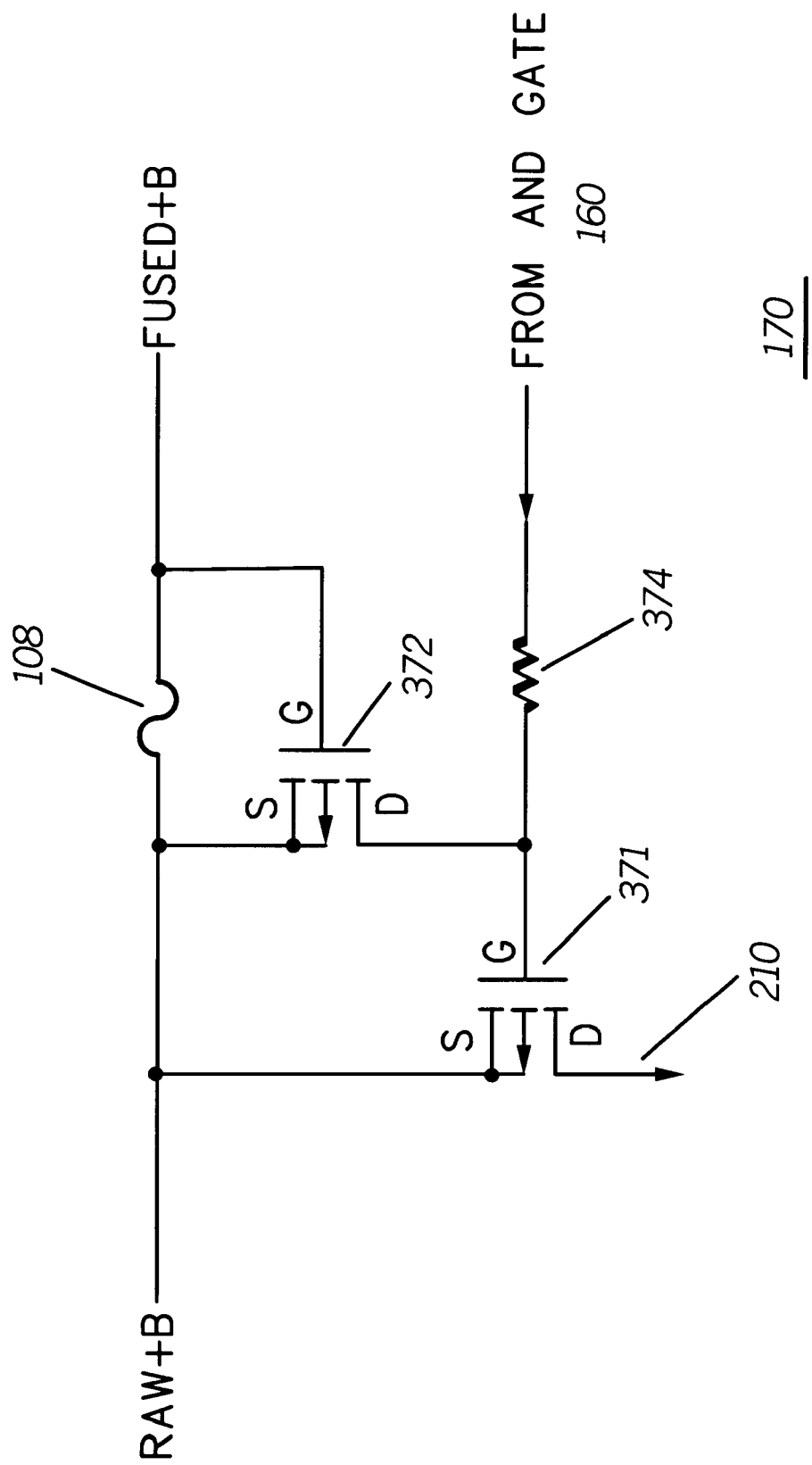
FIG. 3 is a block diagram of the fuse sensor 170 of FIG. 1.

Referring to FIG. 3, a more detailed block diagram of the fuse sensor 170 is shown with two transistors. Preferably, a drain switch comprises a P-Channel MOSFET device 371 having its source connected to the raw +B, its drain connected to the drain of the power amplifier to provide the drain signal 210 and its gate connected to the drain of a second P-Channel MOSFET 372 and to the output of the AND gate 160 via a resistor 374. The drain current or signal 210 does not flow through the fuse 108 to minimize ohmic losses that would result in RF output power reduction due to limitation of the available drain voltage after its current dissipation through the resistance present. To provide blown fuse protection, the source of MOSFET 372 is connected to the raw +B and the gate is connected to the fused +B. Both P-Channel MOSFET devices 371 and 372 are available from TEMIC Semiconductors as a new model number Si4463DY or its equivalent.

Referring to FIGS. 1–3, when the fuse 108 is blown, fused +B becomes LOW and the second MOSFET 372 conducts, pulling the gate of the first MOSFET 371 HIGH. The first transistor 371 is then disabled thus protecting the power amplifier 106 from being turned ON when the fuse 108 is blown. If the second transistor 372 of for the blown fuse protection was not present, the power amplifier 106 could go into failure mode and burn if its bias was not supplied before its main power. Without the presence of the second transistor 372, when the fuse 108 is blown, fused +B would become LOW and the first MOSFET 371 would conduct activating the power amplifier 106 by supplying its power. The first transistor 371 is then enabled ON when the fuse 108 is blown. Hence, the drain of the power amplifier 106 is not connected directly to the raw +B battery supply because it would draw enormous amount of current when the gate bias for the power amplifier is not present. Instead, the gate of the drain switch or the first MOSFET device 371, is turned ON and OFF during the TDMA transmit time slots, in accordance with the output of the AND gate 160. The AND gate 160 thus disables the drain switch 371 through its gate input if the negative bias source 150 is not turned ON due to a software failure, as from the controller 120 or other sources.

What is claimed is:

1. A power amplifier stage for operating in a Cartesian feedback loop, the power amplifier stage comprising:
  a linear radio frequency (RF) power amplifier, having an input signal from a Cartesian feedback forward path AC coupled at a first port, for amplifying the input signal and producing an output signal corresponding thereto AC coupled to a second port, the first port receiving a DC amplifier bias potential for controlling the power gain of the RF amplifier stage and the second port for receiving a power supply;
  a bias control for switchably providing the DC amplifier bias potential at the first port; and
  a supply control for switchably providing the power supply in response to the bias control at the second port, wherein the supply control includes a fuse sensor for disabling the second port in response to sensing a blown fuse coupled to the power supply.

2. The amplifier stage according to claim 1, wherein the RF power amplifier comprises a transistor selected from the group consisting of:
  field effect transistor (FET) devices;
  heterostructure field effect transistor (H-FET) devices;
  metal semiconductor field effect transistor (MESFET);
  metal oxide semiconductor field effect transistor (MOSFET) devices; and
  pseudomorphic high electron mobility transistor (PHEMT).

3. The amplifier stage according to claim 1, wherein the RF amplifier comprises a pseudomorphic high electron mobility transistor (PHEMT).

4. The amplifier stage according to claim 1, wherein the bias control and the supply control comprise a switched bias circuitry for selecting an optimum operating bias for a nominal 3.6 volts output signal to improve power efficiency and minimize current drain at about 800 MHz.

5. The amplifier stage according to claim 1, wherein the bias control comprises an operational amplifier for receiving a fixed negative bias source and a positive range of digital-to-analog input signals for level shifting and scaling the positive range of digital to analog signals to provide a shifted negative DC amplifier bias potential range at the first port.

6. The amplifier stage according to claim 5, wherein the bias control includes a first delay; and the supply control includes a second delay wherein the second delay is longer than the first delay to ensure that a shifted negative DC amplifier bias potential is provided at the first port before providing the power supply at the second port for activating the RF power amplifier.

7. The amplifier stage according to claim 6, wherein the second delay is a predetermined period between TDMA transmit time slots such that the power supply is only provided at the second port during the TDMA transmit time slot.

8. The amplifier stage according to claim 5, wherein the bias control includes a third delay; and the supply control includes a fourth delay wherein the third delay is longer than the fourth delay to ensure that the power supply at the second port is removed before removing the shifted negative DC amplifier bias potential at the first port for de-activating the RF power amplifier.

9. The amplifier stage according to claim 7, wherein the first delay comprises about 4 milliseconds shorter than the predetermined period between TDMA transmit time slots such that the operational amplifier is warmed-up sufficiently prior to providing the shifted negative DC amplifier bias potential at the first port during the TDMA transmit time slot.

10. The amplifier stage according to claim 8, wherein the third delay comprises about 1 milliseconds longer than the predetermined period between TDMA transmit time slots such that the power amplifier is turned OFF sufficiently prior to removing the shifted negative DC amplifier bias potential at the first port during a non-TDMA transmit time slot.

11. The amplifier stage according to claim 7, wherein the supply control comprises:
  an AND gate for providing the power supply only during the TDMA transmit time slot.

12. The amplifier stage according to claim 1, further comprising a coupler for coupling the output signal to a Cartesian feedback reverse path.

13. A power amplifier stage comprising:
  a linear radio frequency (RF) power amplifier, having a gate for switchably receiving a DC amplifier bias potential for controlling the power gain of the RF amplifier stage and a drain for switchably receiving a battery supply;
  a controller for generating a first control signal for defining a first activation period during a TDMA transmit time slot and a second control signal for defining a second activation period, the second activation period being longer than the first activation period to cover the TDMA transmit time slot;

an AND gate for receiving the first and second control signals for providing an ANDed output signal to allow the flow of the battery supply to the drain during the TDMA transmit time slot of the first control signal;

a fuse sensor for disabling the drain and overriding the AND gate output signal in response to sensing a blown fuse battery supply condition; and an operational amplifier for receiving a fixed negative bias source signal, a positive digital-to-analog gain control signal, and the second control signal for level shifting and scaling the positive digital-to-analog signal to provide a shifted negative DC amplifier bias potential to the gate during the second activation period to ensure the gate is activated before the drain.

14. The power amplifier stage of claim 13, further comprising a negative bias source for providing the fixed negative bias source signal during the second activation period.

15. The power amplifier stage of claim 13, further comprising a negative bias source for providing the fixed negative bias source signal only during the second activation period.

16. The power amplifier stage of claim 13, further comprising a negative bias source for switching OFF the fixed negative bias source signal substantially during a non-TDMA transmit time slot.

17. The power amplifier stage of claim 13, further comprising a digital-to analog converter for converting a predetermined factory set gain control input into the positive digital-to-analog gain control signal.

18. A method of bias control for a linear radio frequency (RF) power amplifier in a TDMA communication device, the method comprising:

generating a first control signal for defining a first activation period during a TDMA transmit time slot and generating a second control signal for defining a second activation period, the second activation period being longer than the first activation period to cover the TDMA transmit time slot;

sensing whether a battery fuse connected to a battery supply is blown;

allowing a battery supply flow to the drain of the RF power amplifier during the TDMA transmit time slot of the first control signal if the battery fuse is not blown; and level shifting and scaling a positive digital-to-analog signal to provide a shifted negative DC amplifier bias potential to the gate of the RF power amplifier during the second activation period to ensure the gate is activated before the drain.

* * * * *

UNITED STATES PATENT AND TRADEMARK OFFICE
CERTIFICATE OF CORRECTION

PATENT NO.   : 6,043,712
DATED        : March 28, 2000
INVENTOR(S)  : Leizerovich et al.

It is certified that error appears in the above-identified patent and that said Letters Patent is hereby corrected as shown below:

<u>Title page,</u>
Item [75], Inventors' names: add the following two inventors:
-- Gary D. Jones -- as the third inventor -- Antony Christian -- as the fourth inventor.

Signed and Sealed this

Thirtieth Day of July, 2002

Attest:

Attesting Officer

JAMES E. ROGAN
*Director of the United States Patent and Trademark Office*